(12) United States Patent
Bedell et al.

(10) Patent No.: US 7,682,917 B2
(45) Date of Patent: Mar. 23, 2010

(54) DISPOSABLE METALLIC OR SEMICONDUCTOR GATE SPACER

(75) Inventors: Stephen W. Bedell, Wappingers Falls, NY (US); Michael Chudzik, Danbury, CT (US); William K. Henson, Beacon, NY (US); Naim Moumen, Walden, NY (US); Vijay Narayanan, New York, NY (US); Devendra K. Sadana, Pleasantville, NY (US); Kathryn T. Schonenberg, Wappingers Falls, NY (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 12/016,326

(22) Filed: Jan. 18, 2008

(65) Prior Publication Data

US 2009/0186455 A1 Jul. 23, 2009

(51) Int. Cl.
*H01L 21/336* (2006.01)
(52) U.S. Cl. ................ 438/304; 438/596; 257/E21.438
(58) Field of Classification Search .................. 438/304
See application file for complete search history.

(56) References Cited

U.S. PATENT DOCUMENTS

| | | | | |
|---|---|---|---|---|
| 5,757,045 A | * | 5/1998 | Tsai et al. ................... | 257/336 |
| 6,107,130 A | * | 8/2000 | Fulford et al. .............. | 438/231 |
| 2002/0173093 A1 | * | 11/2002 | Juengling .................... | 438/230 |
| 2003/0032251 A1 | * | 2/2003 | Chen et al. .................. | 438/311 |
| 2005/0048731 A1 | * | 3/2005 | Patton et al. ................ | 438/304 |

\* cited by examiner

*Primary Examiner*—Stephen W Smoot
(74) *Attorney, Agent, or Firm*—Scully, Scott, Murphy & Presser, P.C.; H. Daniel Schnurmann

(57) ABSTRACT

A disposable spacer is formed directly on or in close proximity to the sidewalls of a gate electrode and a gate dielectric. The disposable spacer comprises a material that scavenges oxygen such as a metal, a metal nitride, or a semiconductor material having high reactivity with oxygen. The disposable gate spacer absorbs any oxygen during subsequent high temperature processing such as a stress memorization anneal. A metal is deposited over, and reacted with, the gate electrode and source and drain regions to form metal semiconductor alloy regions. The disposable gate spacer is subsequently removed selective to the metal semiconductor alloy regions. A porous or non-porous low-k dielectric material is deposited to provide a low parasitic capacitance between the gate electrode and the source and drain regions. The gate dielectric maintains the original dielectric constant since the disposable gate spacer prevents absorption of additional oxygen during high temperature processes.

20 Claims, 11 Drawing Sheets

DISPOSABLE METALLIC OR SEMICONDUCTOR GATE SPACER

FIELD OF THE INVENTION

The present invention generally relates to semiconductor devices, and particularly to methods of forming complementary metal-oxide-semiconductor (CMOS) devices with low capacitance between a gate electrode and source and drain regions and/or with a high dielectric constant gate dielectric protected from excessive oxidation by an oxygen scavenging metallic or semiconductor gate spacer.

BACKGROUND OF THE INVENTION

A gate spacer is formed around edges of a gate electrode that is located over a channel area of a field effect transistor. The gate spacer comprises a dielectric material to prevent an electrical short between the gate electrode and source and drain regions. The gate spacer allows formation of a self-aligned silicide (salicide) without electrically bridging the gate conductor and the source and drain regions. The gate spacer is also used to control the proximity of the source and drain regions to the edges of the gate electrode.

Silicon nitride and silicon oxide are typically employed as the gate spacer for the practical reason that these materials may be etched selective to silicon. Further, silicon oxide and silicon nitride may also be etched selective to each other by a wet etch or a reactive ion etch (RIE). Use of a plurality of spacers employing silicon nitride and silicon oxide is also known in the art. One of the drawbacks of conventional gate spacers employing silicon nitride and/or silicon oxide is the formation of a parasitic capacitor between the gate electrode and contacts to the source and drain regions. Specifically, the gate electrode functions as one electrode of the parasitic capacitor, the contacts to the source and drain regions function as another electrode of the parasitic capacitor, and the gate spacer functions as the capacitor dielectric. The dielectric constants of silicon nitride and silicon oxide are 7.5 and 3.9, respectively, which provide a relatively high parasitic capacitance between the gate electrode and the source and drain regions.

While use of silicon oxide provides reduced parasitic capacitance between a gate electrode and contacts to the source and drain regions relative to silicon nitride due to a lower dielectric constant of silicon oxide than that of silicon nitride, use of silicon oxide allows diffusion of oxygen to a gate dielectric. Such diffusion of oxygen through a silicon oxide gate spacer induces changes in composition in a high-k gate dielectric material, which results in a shift in a threshold voltage (Vt) as a result of the compositional change of the high-k gate dielectric material.

Thus, silicon nitride employed as a gate spacer induces a high parasitic capacitance, while silicon oxide employed as a gate spacer provides a path for diffusion of oxygen to the gate dielectric and subsequent shift in the threshold voltage of the field effect transistor.

In view of the above, there exists a need for methods of forming a field effect transistor having a reduced parasitic capacitance, while preventing diffusion of oxygen to a high-k gate dielectric.

SUMMARY OF THE INVENTION

The present invention addresses the needs described above by providing methods of forming a field effect transistor having low parasitic capacitance between a gate electrode and source and drain regions, while preventing oxidation of a high-k gate dielectric by providing a disposable gate spacer comprising an oxygen scavenging material such as a metal, a metal nitride, or a semiconductor material.

In the present invention, a disposable spacer is formed directly on, or in close proximity to, the sidewalls of a gate electrode and a gate dielectric. The disposable spacer comprises a material that scavenges oxygen such as a metal, a metal nitride, or a semiconductor material having high reactivity with oxygen. The disposable gate spacer absorbs any oxygen during subsequent high temperature processing such as a stress memorization anneal. A metal is deposited over, and reacted with, the gate electrode and source and drain regions to form metal semiconductor alloy regions. The disposable gate spacer is subsequently removed selective to the metal semiconductor alloy regions. A porous or non-porous low-k dielectric material is deposited to provide a low parasitic capacitance between the gate electrode and the source and drain regions. The gate dielectric maintains the original dielectric constant since the disposable gate spacer prevents absorption of additional oxygen during high temperature processes.

According to an aspect of the present invention, a method of forming a semiconductor structure is provided, which comprises:

forming a stack of a gate dielectric and a gate electrode on a semiconductor substrate;

forming a disposable gate spacer comprising a metal, a metal nitride, or a germanium containing alloy on sidewalls of the gate dielectric and the gate electrode;

forming source and drain metal semiconductor alloy regions that are offset from the sidewalls by the disposable gate spacer on the semiconductor substrate; and removing the disposable gate spacer selective to the source and drain metal semiconductor alloy regions and the gate electrode.

In one embodiment, the method further comprises forming a dielectric gate spacer directly on the sidewalls prior to the forming of the disposable gate spacer.

In another embodiment, the disposable gate spacer is formed directly on the dielectric gate spacer.

In even another embodiment, the dielectric gate spacer has an L-shaped vertical cross-sectional area.

In yet another embodiment, the disposable gate spacer comprises one of Ta, Ti, TaN, TiN, Ge, or a SiGe alloy.

In still another embodiment, the disposable gate spacer is formed directly on the sidewalls.

In a further embodiment, the method further comprises:

forming a middle-of-line dielectric layer comprising a dielectric material having a dielectric constant about 3.9 or less directly on the dielectric gate spacer after removal of the disposable gate spacer; and forming source and drain contacts directly on the source and drain metal semiconductor alloy regions.

In an even further embodiment, the middle-of-line dielectric layer comprises a low-k dielectric material having a dielectric constant about 2.8 or less.

In a yet further embodiment, the method further comprises forming contacts to the source and drain metal semiconductor alloy regions, wherein the middle-of-line dielectric layer laterally abuts the dielectric gate spacer and the contacts and vertically abuts the source and drain metal semiconductor alloy regions.

In a still further embodiment, the method further comprises forming contacts to the source and drain metal semiconductor alloy regions, wherein the middle-of-line dielectric layer laterally abuts the sidewalls and the contacts and vertically abuts the source and drain metal semiconductor alloy regions.

According to another aspect of the present invention, another method of forming a semiconductor structure is provided, which comprises:

forming a stack of a gate dielectric and a gate electrode on a semiconductor substrate, wherein the gate dielectric comprises a dielectric metal oxide having a dielectric constant about 8.0 or greater;

forming a disposable gate spacer comprising a metal or a metal nitride on sidewalls of the gate dielectric and the gate electrode;

forming source and drain metal semiconductor alloy regions that are offset from the sidewalls by the disposable gate spacer on the semiconductor substrate; and removing the disposable gate spacer selective to the source and drain metal semiconductor alloy regions and the gate electrode.

In one embodiment, the gate dielectric comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from about 0.5 to about 3 and each value of y is independently from 0 to about 2.

In another embodiment, the disposable gate spacer comprises Ta, Ti, TaN, or TiN.

In even another embodiment, the source and drain metal semiconductor alloy regions comprise a nickel silicide or a nickel platinum silicide.

In a yet further embodiment, the method further comprises forming a dielectric gate spacer directly on the sidewalls prior to the forming of the disposable gate spacer.

In a still further embodiment, the dielectric gate spacer comprises silicon oxide and has a thickness from about 1 nm to about 10 nm, wherein the disposable gate spacer is formed directly on the dielectric gate spacer.

In a further embodiment, the method further comprises:

forming a middle-of-line dielectric layer comprising a dielectric material having a dielectric constant about 3.9 or less directly on the dielectric gate spacer after removal of the disposable gate spacer; and forming source and drain contacts directly on the source and drain metal semiconductor alloy regions.

In an even further embodiment, the middle-of-line dielectric layer comprises a low-k dielectric material having a dielectric constant about 2.8 or less.

According to yet another aspect of the present invention, yet another method of forming a semiconductor structure is provided, which comprises:

forming a stack of a gate dielectric and a gate electrode on a semiconductor substrate;

forming a disposable gate spacer comprising a germanium containing material on sidewalls of the gate dielectric and the gate electrode;

forming source and drain metal semiconductor alloy regions that are offset from the sidewalls by the disposable gate spacer on the semiconductor substrate; and removing the disposable gate spacer selective to the source and drain metal semiconductor alloy regions and the gate electrode.

In one embodiment, the method further comprises forming a dielectric gate spacer directly on the sidewalls prior to the forming of the disposable gate spacer.

In another embodiment, the method further comprises:

forming a middle-of-line dielectric layer comprising a dielectric material having a dielectric constant about 3.9 or less directly on the dielectric gate spacer after removal of the disposable gate spacer; and forming source and drain contacts directly on the source and drain metal semiconductor alloy regions.

In even another embodiment, the middle-of-line dielectric layer comprises a low-k dielectric material having a dielectric constant about 2.8 or less.

In yet another embodiment, the disposable gate spacer is formed directly on the sidewalls.

In still another embodiment, the method further comprises:

forming a middle-of-line dielectric layer comprising a dielectric material having a dielectric constant about 3.9 or less directly on the sidewalls of the gate electrode after removal of the disposable gate spacer; and forming source and drain contacts directly on the source and drain metal semiconductor alloy regions.

In a further embodiment, the middle-of-line dielectric layer comprises a low-k dielectric material having a dielectric constant about 2.8 or less.

In a yet further embodiment, the germanium containing material comprises at least 75% of germanium in atomic concentration.

In a still further embodiment, the germanium containing material comprises pure germanium, doped germanium, an undoped silicon germanium alloy, or a doped silicon germanium alloy.

DETAILED DESCRIPTION OF THE INVENTION

Figure 1:
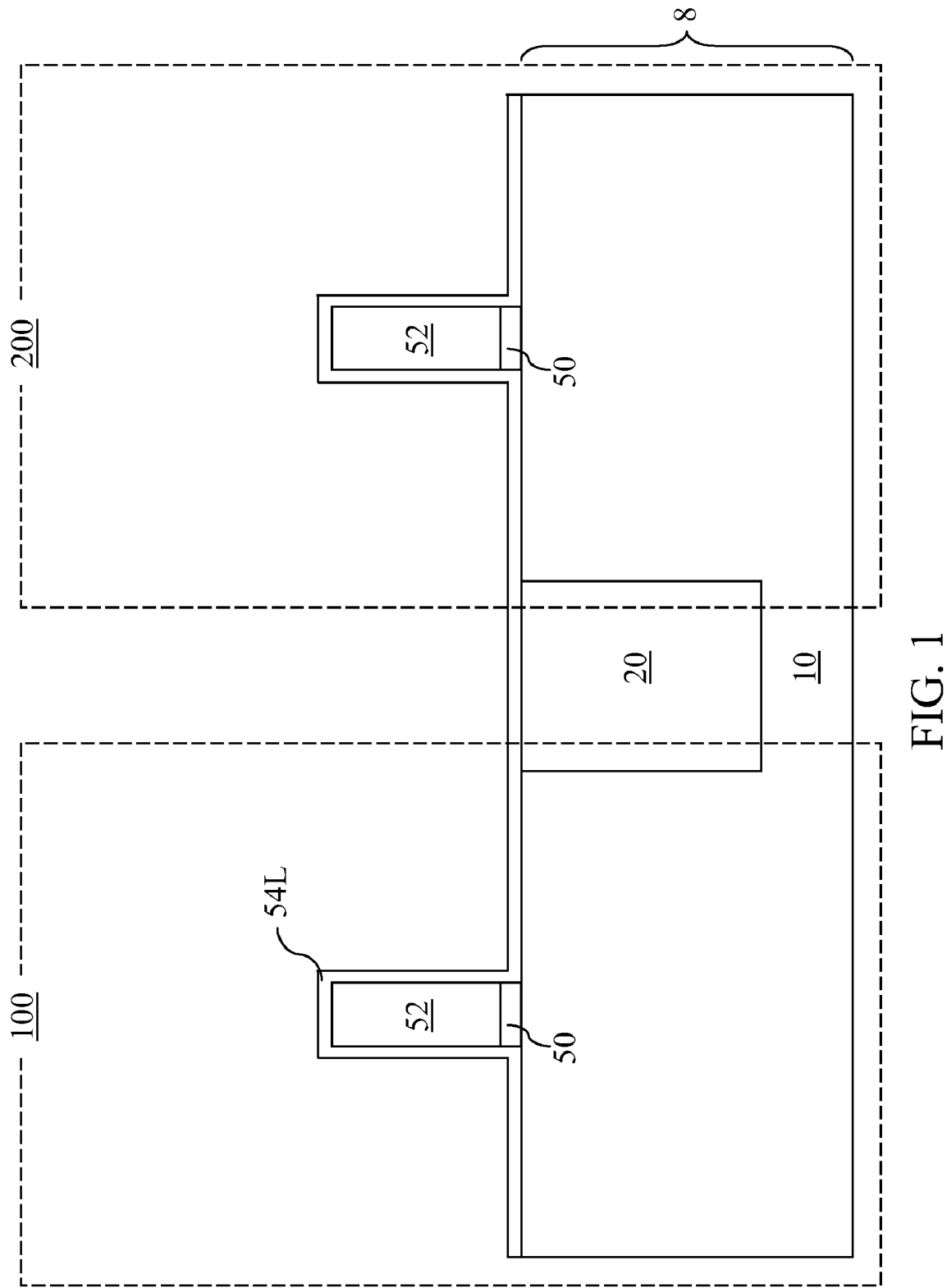
FIGS. 1-9 are sequential vertical cross-sectional views of a first exemplary semiconductor structure according to a first embodiment of the present invention at various stages of a manufacturing process.

As stated above, the present invention relates to methods of forming complementary metal-oxide-semiconductor (CMOS) devices with low capacitance between a gate electrode and source and drain regions and/or with a high dielectric constant gate dielectric protected from excessive oxidation by an oxygen scavenging metallic or semiconductor gate spacer, which are now described in detail with accompanying figures. It is noted that like and corresponding elements are referred to by like reference numerals.

Referring to FIG. 1, a first exemplary semiconductor structure according to the present invention is shown, which comprises a semiconductor substrate 8 containing a substrate semiconductor layer 10 and a shallow trench isolation structure 20. The substrate semiconductor layer 10 comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. Preferably, the substrate semiconductor layer 10 is single crystalline. The semiconductor substrate 8 may be a bulk substrate, a semiconductor-on-insulator (SOI) substrate, or a hybrid substrate. The semiconductor substrate 8 may have a built-in stress in the substrate semiconductor layer 10. While the present invention is described with a bulk substrate, implementation of the present invention on an SOI substrate or on a hybrid substrate is explicitly contemplated herein.

The shallow trench isolation structure 20 comprises a dielectric material such as silicon oxide or silicon nitride, and is formed by methods well known in the art. The exemplary semiconductor structure comprises an n-type field effect transistor (NFET) region 100, in which an n-type field effect transistor (NFET) having electrons as charge carriers is to be formed, and a p-type field effect transistor (PFET) region 200, in which a p-type field effect transistor (PFET) having holes as charge carriers is to be formed. Each of the NFET region 100 and the PFET region 200 comprises a non-overlapping portion of a substrate semiconductor layer 10. The portion of the substrate semiconductor layer 10 in the NFET region 100 is electrically isolated from the portion of the substrate semiconductor layer 10 in the PFET region 200 above the bottom surface of the shallow trench isolation structure 20 by the shallow trench isolation structure 20.

A gate dielectric layer and a gate conductor layer are formed on the semiconductor substrate 8 and are lithographically patterned to form a gate dielectric 50 and a gate electrode 52 in each of the NFET region and the PFET region. Specifically, the gate dielectric layer is formed on a top surface of the semiconductor substrate 8 by methods well known in the art including, for example, thermal oxidation, thermal nitridation, a chemical vapor deposition (CVD), an atomic layer deposition (PVD), molecular beam epitaxy (MBE), pulsed laser deposition (PLD), liquid source misted chemical deposition (LSMCD), or a combination thereof.

Each gate dielectric 50 may comprise a silicon oxide based dielectric material. In this case, the silicon oxide based dielectric material may be thermal silicon oxide or a combination of thermal silicon oxide and thermal silicon oxynitride.

Alternately, each gate dielectric 50 may comprise a dielectric metal oxide having a dielectric constant that is greater than the dielectric constant of silicon oxide of 3.9. The dielectric metal oxide is a high-k material containing a metal and oxygen. The dielectric material may be, for example, $HfO_2$, $ZrO_2$, $La_2O_3$, $Al_2O_3$, $TiO_2$, $SrTiO_3$, $LaAlO_3$, $Y_2O_3$ or an alloy thereof. The dielectric metal oxide may be a stoichiometric compound or a non-stoichiometric compound. In this case, the thickness of each gate dielectric 50 may be from about 2 nm to about 6 nm, and may have an effective oxide thickness on the order of or less than 1 nm.

Each gate electrode comprises a conductive material such as a heavily doped semiconductor material, a metal, a conductive metal nitride, or a combination thereof. In case the gate electrodes 52 comprise a doped semiconductor material, such doped semiconductor material may be silicon, a silicon germanium alloy, a silicon carbon alloy, or a silicon germanium carbon alloy. If the gate electrodes 52 comprise germanium, the concentration of germanium is less than 75% in atomic concentration, and preferably less than 10% in atomic concentration.

Alternately or additionally, the gate electrodes 52 may comprise a metal gate layer (not shown separately) formed by chemical vapor deposition (CVD), physical vapor deposition (PVD), atomic layer deposition (ALD), etc. and comprising a conductive refractory metal nitride. For example, the metal gate layer may comprise a material such as TaN, TiN, WN, TiAlN, TaCN, other conductive refractory metal nitride, or an alloy thereof The thickness of the metal gate layer may be from about 5 nm to about 40 nm, and preferably from about 7 nm to about 20 nm. The composition of the metal gate layer may be selected to optimize threshold voltages of the NFET and the PFET to be subsequently formed in the NFET region 100 and the PFET region 200.

In a non-limiting exemplary embodiment, the gate dielectrics 50 may comprise a high-k material comprising a metal and oxygen and the gate electrodes 52 may comprise a metal gate layer vertically abutting the gate dielectrics. Each of the gate electrodes 52 may further include a silicon containing gate conductor layer (not shown) located above the metal gate layer and comprising a silicon containing material such as amorphous silicon, an amorphous silicon containing alloy, polysilicon and/or a polycrystalline silicon containing alloy. Exemplary silicon containing alloys are silicon germanium alloy, silicon carbon alloy, and silicon germanium carbon alloy. The silicon containing material may be doped with dopants such as B, Ga, In, P, As, and/or Sb, or may be substantially undoped. The silicon containing material may be differentially doped between the NFET region 100 and the PFET region 200. Typically, the portion of the silicon containing gate conductor layer in the NFET region 100 is doped with n-type dopants, while the portion of the silicon containing gate conductor layer in the PFET region 200 is doped with p-type dopants. The thickness, i.e., the height, of the silicon containing gate conductor layer may vary depending on the technique used in forming the same. The silicon containing gate conductor layer 44 may have a thickness from about 20 to about 200 nm, with a thickness from about 40 to about 150 nm being more typical.

After formation of the gate dielectric layer and the gate conductor layer, lithographic patterning and a reactive ion etch are performed on the stack of the gate dielectric layer and the gate conductor layer to form a first gate stack in the NFET region 100 and a second gate stack in the PFET region 200, respectively. Each of the first gate stack and the second gate stack comprises a gate dielectric 50 and a gate electrode 52.

An optional dielectric layer 54L is optionally formed on the exposed surfaces including the sidewalls of the gate electrodes 52 and the sidewalls of the gate dielectrics 50. The optional dielectric layer 54L may be formed by low pressure chemical vapor deposition (LPCVD), rapid thermal chemical vapor deposition (RTCVD), plasma enhanced chemical vapor deposition (PECVD), etc. The optional dielectric layer 54L comprises a dielectric material such as dielectric oxide or a dielectric nitride. For example, the optional dielectric layer 54L may comprise silicon oxide. The thickness of the optional dielectric layer 54L may be from 1 nm to about 10 nm, and preferably from about 1 nm to about 5 nm, although lesser and greater thicknesses are also explicitly contemplated herein. The optional dielectric layer 54 is optional, i.e., may, or may not be formed. In a first embodiment, the optional dielectric layer 54L is formed directly on the sidewalls of the gate electrodes and gate dielectrics 50. In a second embodiment, the optional dielectric layer 54L is omitted.

Various source and drain extension implantations and halo implantations may be performed employing various block level masks at suitable processing steps to form source and drain extension regions (not shown) and/or halo regions (not shown) within the semiconductor substrate layer 10.

Figure 2:
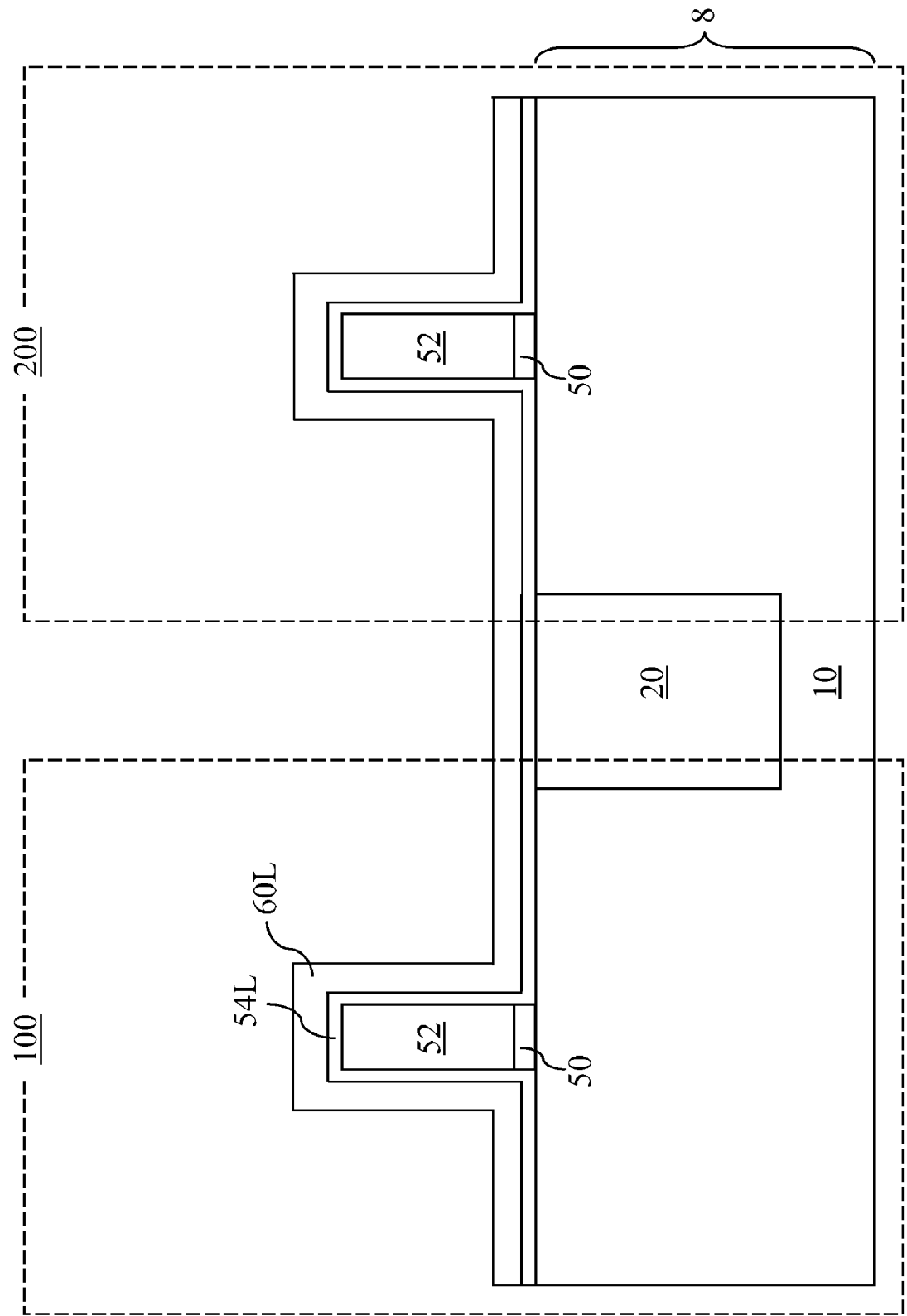

Referring to FIG. 2, a disposable gate spacer layer 60L is formed either directly on the sidewalls of the optional dielectric layer 54L, if it is present, or directly on the sidewalls of the gate electrodes 52 and the gate dielectrics 50, if an optional dielectric layer is not present. The disposable gate spacer layer 60L comprises a metal, a metal nitride, or a germanium containing alloy. Preferably, the disposable gate spacer layer 60L comprises a material that scavenges oxygen, i.e., a material that provides a higher reactivity with, and/or affinity to, oxygen than the material of the gate dielectrics 50. The thickness of the disposable gate spacer layer 60L is determined based on a desired offset between the sidewalls of the gate electrodes 52 and the gate dielectrics 50 and source and drain metal semiconductor alloy regions to be subsequently formed on the semiconductor substrate 8. The thickness of the disposable gate spacer layer 60L may be from about 5 nm to about 100 nm, and typically from about 10 nm to about 50 nm, although lesser and greater thicknesses are explicitly contemplated herein.

In one embodiment, the disposable gate spacer layer 60L comprises a metal or a metal nitride such as Ta, Ti, TaN, TiN, another metal, or another metal nitride. The metal or the metal nitride may be formed by chemical vapor deposition (CVD), atomic layer deposition (ALD), physical vapor deposition, or by other methods known in the art.

In another embodiment, the disposable gate spacer layer 60L comprise a germanium containing material such as pure germanium, doped germanium, an undoped silicon germanium alloy, or a doped silicon germanium alloy. Preferably, the germanium containing material comprises at least 75% germanium in atomic concentration. The germanium containing material may be formed as an amorphous material or a polycrystalline material by low pressure chemical vapor deposition (LPCVD), plasma enhanced chemical vapor deposition (PECVD), rapid thermal chemical vapor deposition (RTCVD), physical vapor deposition (PVD), or evaporation.

Figure 3:
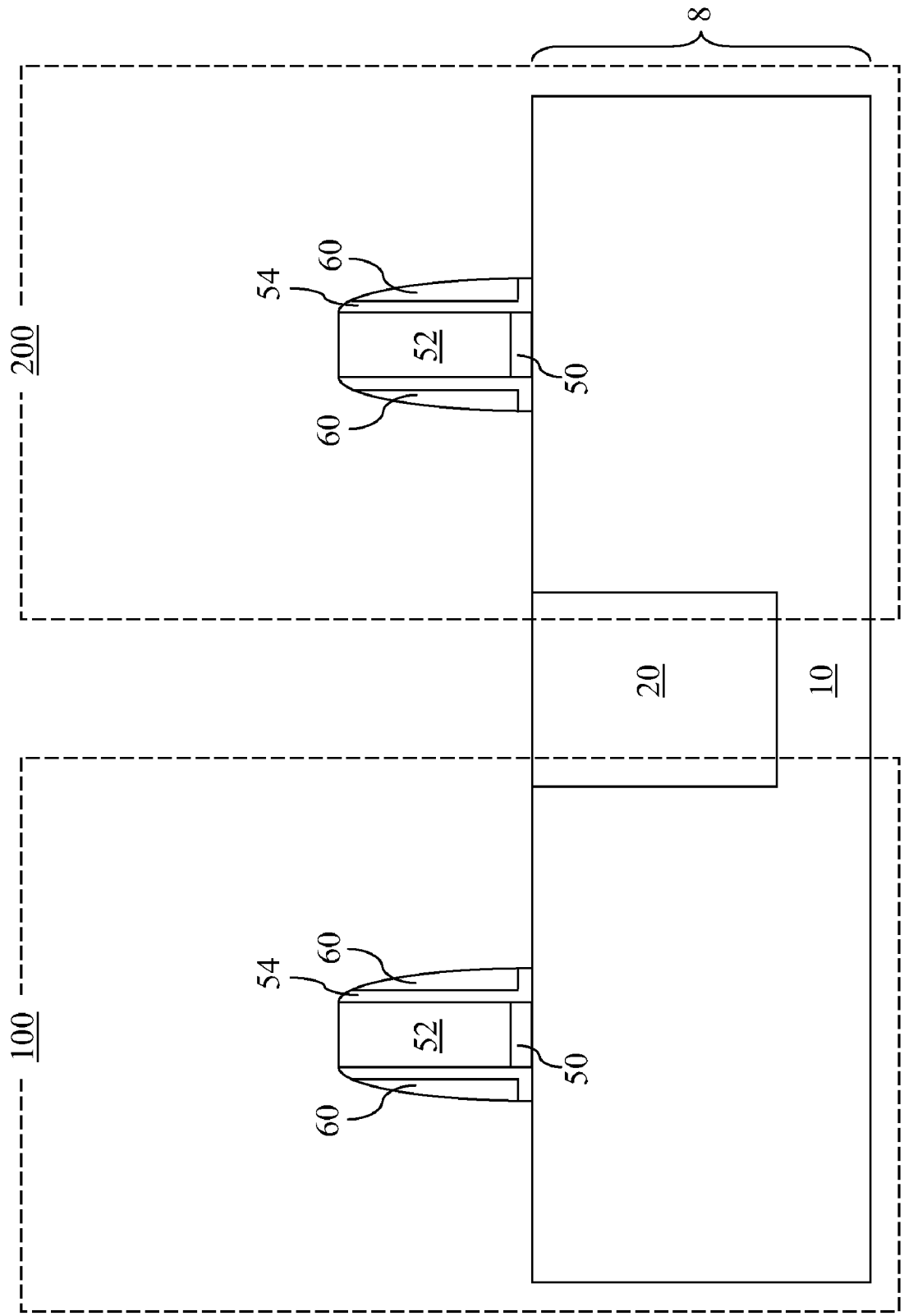

Referring to FIG. 3, an anisotropic reactive ion etch is performed on the disposable gate spacer layer 60L to form a disposable gate spacer 60 around each of the first and second gate stacks. Further, exposed horizontal portions of the optional dielectric layer 54L, if present, are also removed by an etch, which may be a wet etch or a dry etch. The remaining portions of the optional dielectric layer 54L constitutes optional dielectric spacers 54.

In case the optional dielectric layer 54L is present, the anisotropic reactive ion etch may be selective to the optional dielectric layer 54L. Further, the anisotropic reactive ion etch that removes horizontal portions of the disposable gate spacer layer 60L may be selective to the optional dielectric layer 54L. Each optional dielectric spacer 54, which laterally abuts the sidewalls of one of the gate electrodes 52 and one of the gate dielectrics 50, has an L-shaped vertical cross-sectional area. The optional dielectric spacers 54 comprise the same material as the optional dielectric layer 54L, i.e., comprises a dielectric material such as dielectric oxide or a dielectric nitride. Preferably, the optional dielectric spacers 54 comprise silicon oxide. The optional dielectric spacers 54 vertically abut the substrate semiconductor layer 10. Each of the disposable gate spacers 60 abuts the optional dielectric spacers 54, and is separated from the semiconductor substrate layer 10 and one of the gate stacks by the optional dielectric spacers 54.

In case the optional dielectric layer 54L is not present, no optional dielectric spacer is formed. Each disposable gate spacer 60 laterally abuts the sidewalls of one of the gate electrodes 52 and one of the gate dielectrics 50. Further, each disposable gate spacer 60 vertically abuts the semiconductor substrate layer 10.

The disposable gate spacers 60 comprise the same material as the disposable gate spacer layer 60L, i.e., a metal, a metal nitride, or a germanium containing alloy. The thickness of the disposable gate spacers 60, as laterally measured at the base of the disposable gate spacers 60, may be from about from about 5 nm to about 100 nm, and typically from about 10 nm to about 50 nm, although lesser and greater thicknesses are explicitly contemplated herein.

Various source and drain implantations may be performed employing various block level masks at suitable processing steps to form source and drain regions (not shown) within the semiconductor substrate layer 10.

Figure 4:
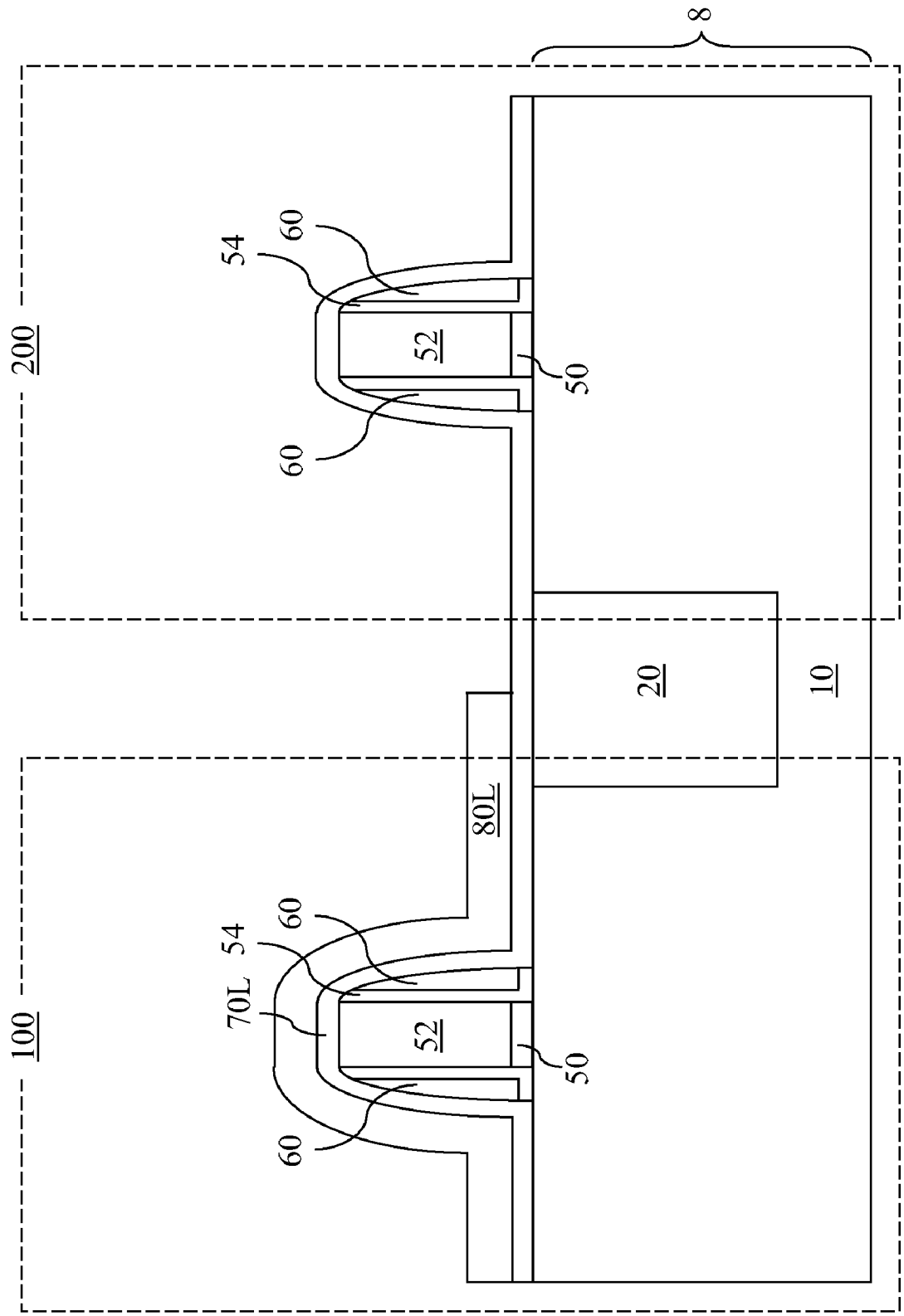

Referring to FIG. 4, various high temperature processing steps may be performed including source and drain activation anneal. In an example, a silicon oxide liner 70L comprising silicon oxide is formed by chemical vapor deposition (CVD) followed by a highly stressed silicon nitride layer 80L, which may have an intrinsically tensile stress or an intrinsically compressive stress. In case the highly stressed silicon nitride layer 80L applies a tensile stress to a portion of the semiconductor substrate layer 10 directly underneath, the highly stressed silicon nitride layer 80L may be patterned such that the highly stressed silicon nitride layer 80L is removed from the PFET region 200, while present in the NFET region 100. Typically, the highly stressed silicon nitride layer 80L applies a stress from about 0.5 GPa to about 5.0 GPa o the semiconductor substrate layer 10 underneath.

By performing a high temperature anneal, stress memorization techniques may be employed to permanently transfer stress from the remaining portion of the highly stressed silicon nitride layer 80L into appropriate portions of the semiconductor substrate layer 10. For example, the tensile stress in a channel region of an NFET, i.e., in the portion of the semiconductor substrate layer directly underneath the gate dielectric 50 in the NFET region 100, which is perpendicular to the direction of the gate electrode 52 in the NFET region 100 is memorized within the channel. Other high temperature processing steps may be performed as needed.

While such high temperature processing steps invariably enhance diffusivity of oxygen and other gases through various portions of the first exemplary semiconductor structure, and especially through any dielectric oxide such as silicon dioxide, the composition of the gate dielectrics 50 remains substantially the same since the disposable gate spacers 60 scavenge oxygen before oxygen atoms or molecules reach the gate dielectrics 50. Such scavenging of oxygen thus has the beneficial effect of maintaining the dielectric constant of the gate dielectrics constant, which, in the absence of any material for scavenging oxygen, would be lowered by incorporation of additional oxygen in case the gate dielectrics 50 comprise a high-k dielectric material such as the dielectric metal oxide discussed above. Thus, the present invention enables high temperature processing on semiconductor structures including gate dielectrics 50 comprising a high-k dielectric material without degrading the dielectric constant due to incorporation of additional oxygen.

Figure 5:
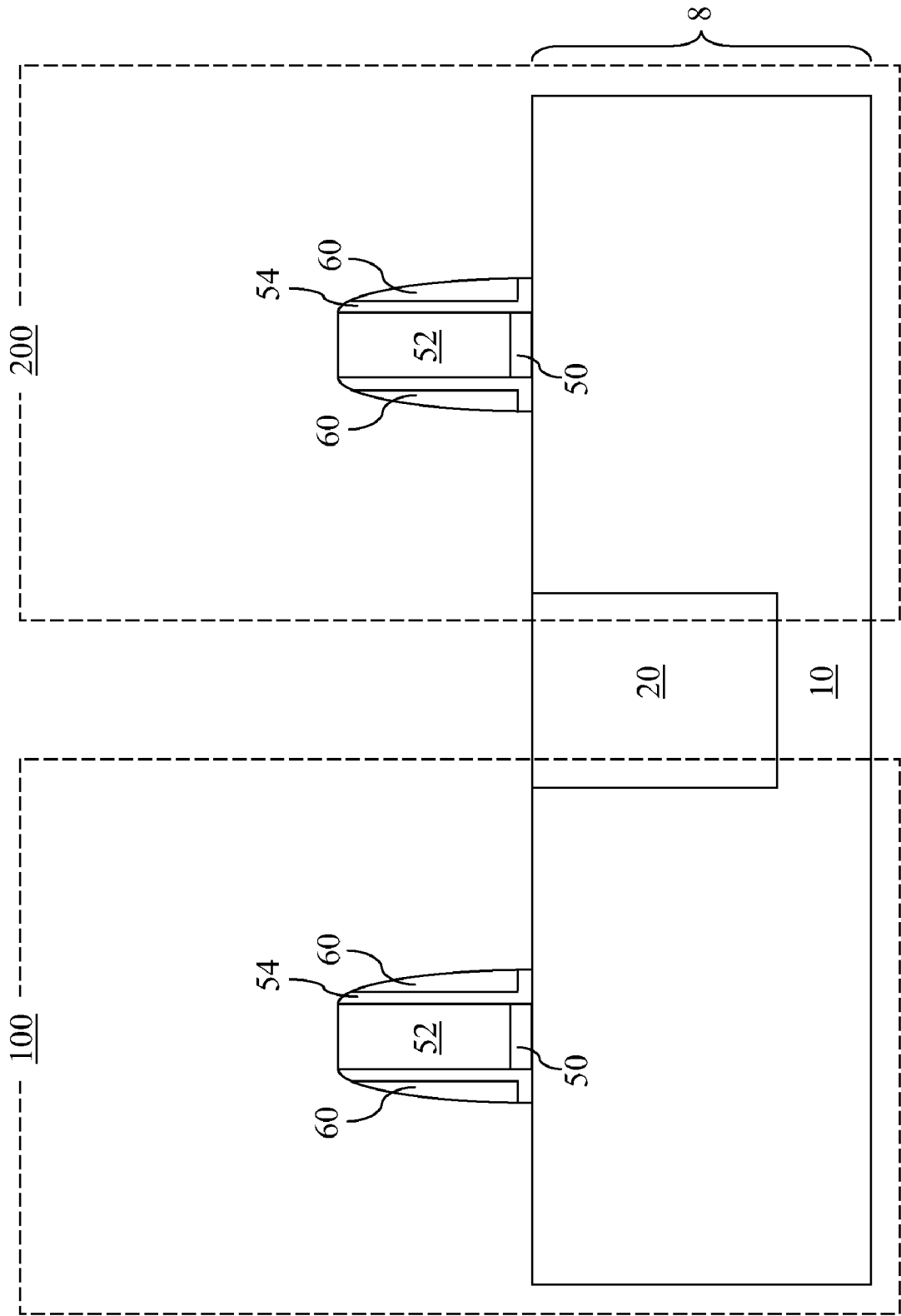

Referring to FIG. 5, the highly stressed silicon nitride layer 80L and the silicon oxide liner 70L are removed by an etch, which may be a wet etch, a dry etch, or a combination thereof. Preferably, the silicon nitride layer 80L is removed selective to the silicon oxide liner 70L, and the silicon oxide liner 70L is removed selective to the underlying structures. A suitable clean may be performed at this step.

Figure 6:
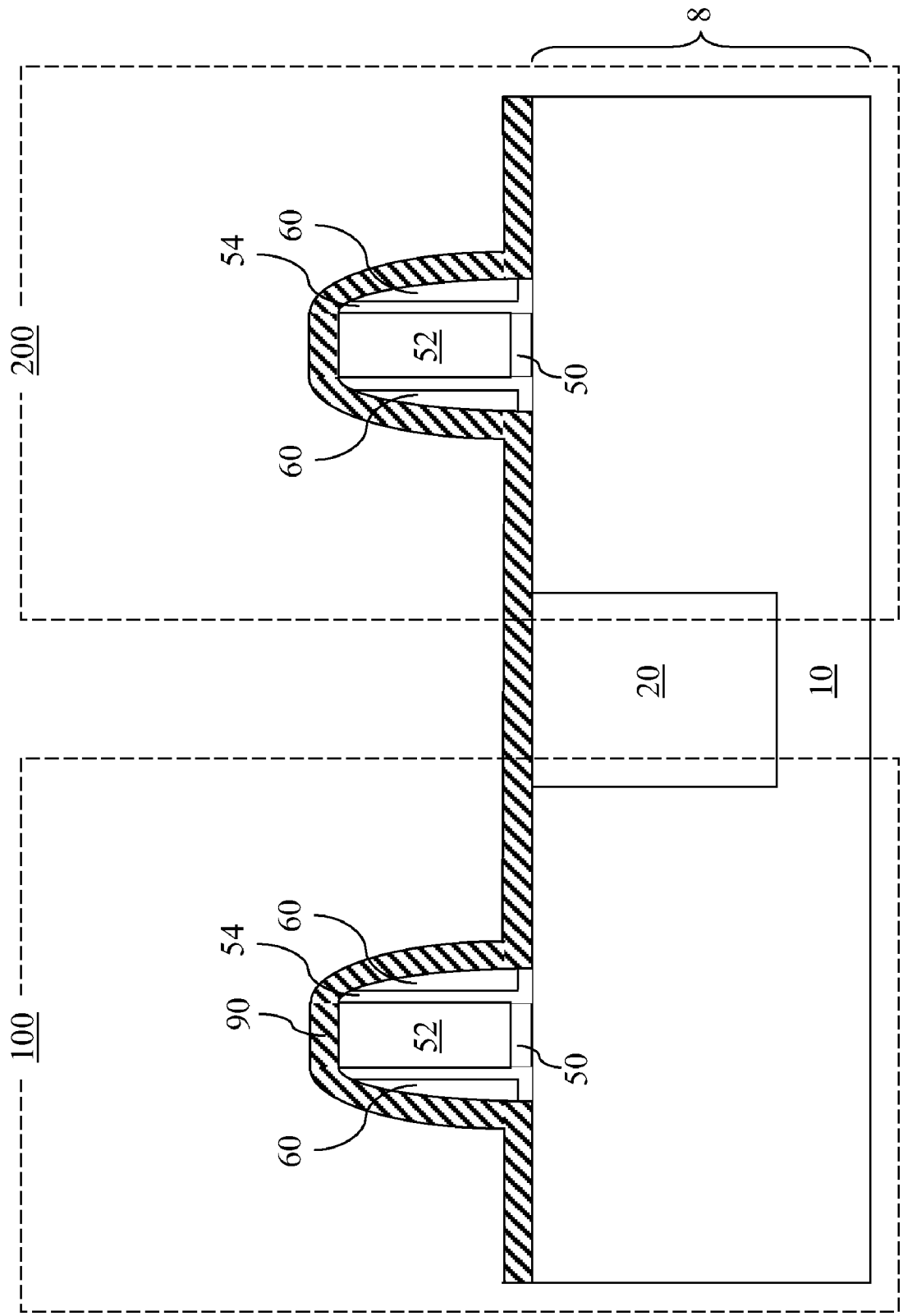

Referring to FIG. 6, a metal layer 90 is deposited directly on the semiconductor substrate layer 10, the disposable gate spacers 60, and top surfaces of the gate electrodes 52. The metal layer 90 comprises a metal capable of forming a metal semiconductor alloy with the semiconductor material of the semiconductor substrate layer 10. Optionally, the metal of the metal layer 90 may be capable of forming another metal semiconductor alloy with the material of the top portions of the gate electrodes 52 if the gate electrodes 52 comprise a semiconductor material. For example, the metal may be tungsten, tantalum, titanium, cobalt, nickel, platinum, osmium, another elemental metal, or an alloy thereof.

A preferred thickness of the metal layer 90 ranges from about 5 nm to about 50 nm, more preferably from about 10 nm to about 25 nm. Preferably, the thickness of the metal layer 90 is sufficient to provide enough metal during a subsequent metallization process to from various metal semiconductor alloy regions. The metal layer 90 can be readily deposited by any suitable deposition technique, including, but not limited to: atomic layer deposition (ALD), chemical vapor deposition (CVD), and physical vapor deposition (PVD). Optionally, a metal nitride capping layer (not shown) may be deposited over the metal layer 90. The metal nitride capping layer may contain a refractory metal nitride such as TaN, TiN, OsN and has a thickness ranging from about 5 nm to about 50 nm, preferably from about 10 nm to about 30 nm.

Figure 7:
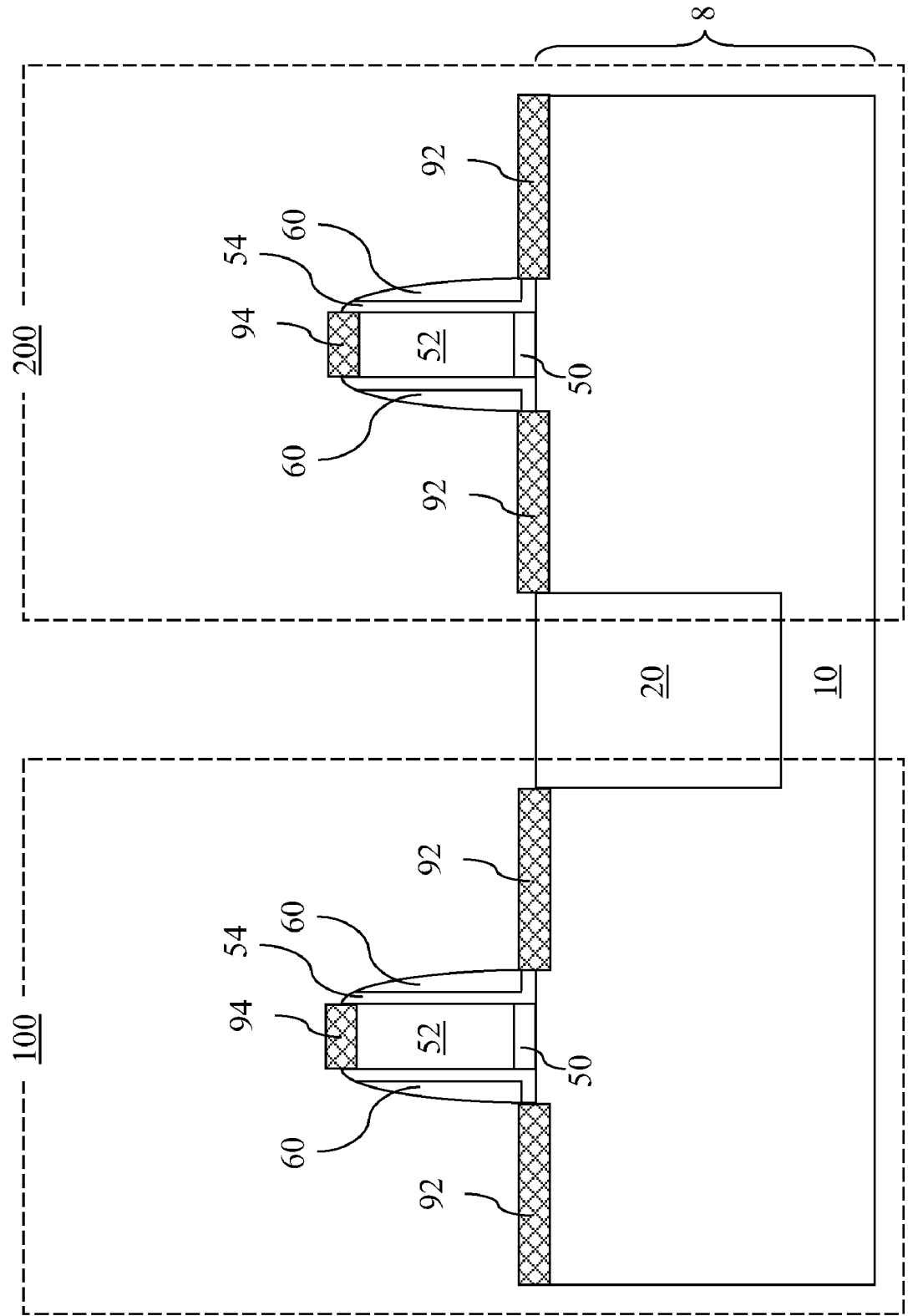

Referring to FIG. 7, the first exemplary semiconductor structure is thereafter annealed at a pre-determined elevated temperature at which the metal layer 90 reacts with the semiconductor material of the semiconductor substrate layer 10, which includes various source and drain regions (not shown), to form source and drain metal semiconductor alloy regions 92. If the top portions of the gate electrode 52 also comprise a semiconductor material, the metal layer 90 may also react with top portions of the gate electrodes 52 to form gate metal semiconductor alloy regions 94. The annealing is typically performed in an inert gas atmosphere, e.g., He, Ar, $N_2$, or forming gas, at a temperature that is conducive to formation of the first metal semiconductor alloy. Multiple annealing temperatures and/or steps may be employed to induce various phases of a metal semiconductor alloy. The anneal temperature ranges from about 100° C. to about 600° C., typically from about 300° C. to about 500° C., and most typically from about 300° C. to about 450° C. A continuous heating at a constant temperature or various ramping in temperature may be employed.

The thickness of the various metal semiconductor alloy portions (92, 94) may be from about 5 nm to about 50 nm, and typically from about 5 nm to about 30 nm, although lesser and greater thicknesses are also contemplated. Unreacted portions of the metal layer 90 are subsequently removed, for example, by aqua regia. The disposable gate spacers 60 provide scavenging effect during the metallization anneal processing steps so that no substantial change in the gate dielectrics 50 occurs during the metallization.

Figure 8:
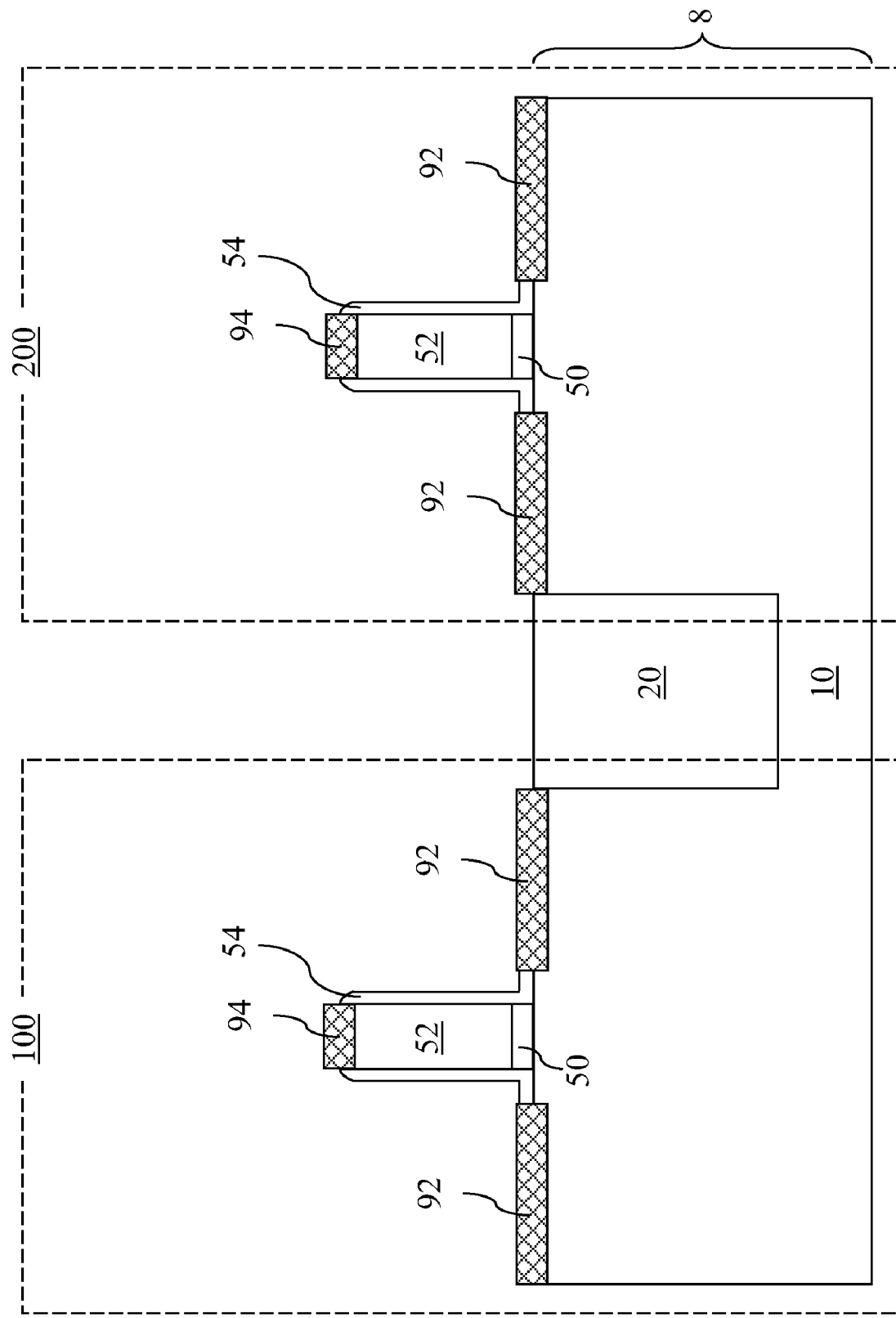

Referring to FIG. 8, the disposable gate spacers 60 are removed by an etch selective to the source and drain metal semiconductor alloy regions 92 and the gate metal semiconductor alloy regions 94. Preferably, the etch is selective to the optional dielectric spacers 54 if the optional dielectric spacers 54 are present. Preferably, the etch is selective to the gate electrodes 52 and the gate dielectrics 50 if an optional dielectric spacer is not present.

In case the disposable gate spacers 60 comprise a germanium containing material such as pure germanium or a germanium containing alloy, the etch may be a wet etch employing hydrogen peroxide ($H_2O_2$) or nitric acid ($HNO_3$). For example, hydrogen peroxide at room temperature etches germanium or a germanium containing alloy having germanium of 75% or more in atomic concentration at a rate of about 10 nm/min or greater, whereas no appreciable etching of silicon, silicon nitride, silicon oxide, or a wide range of other materials employed in semiconductor manufacturing. Alternately, the germanium containing material may be removed by a dry etch such as a reactive ion etch. The germanium containing material may be removed directly, or may be removed by first converting the germanium containing material into a germanium oxide containing material by oxidation, followed by removal of the germanium oxide containing material.

In case the disposable gate spacers 60 comprises a metal or a metal nitride, the metal or the metal nitride is removed selective to the optional dielectric spacers 54 or selective to the gate electrodes 52 and the gate dielectrics 50 by various methods known in the art including wet etches and dry etches.

Figure 9:
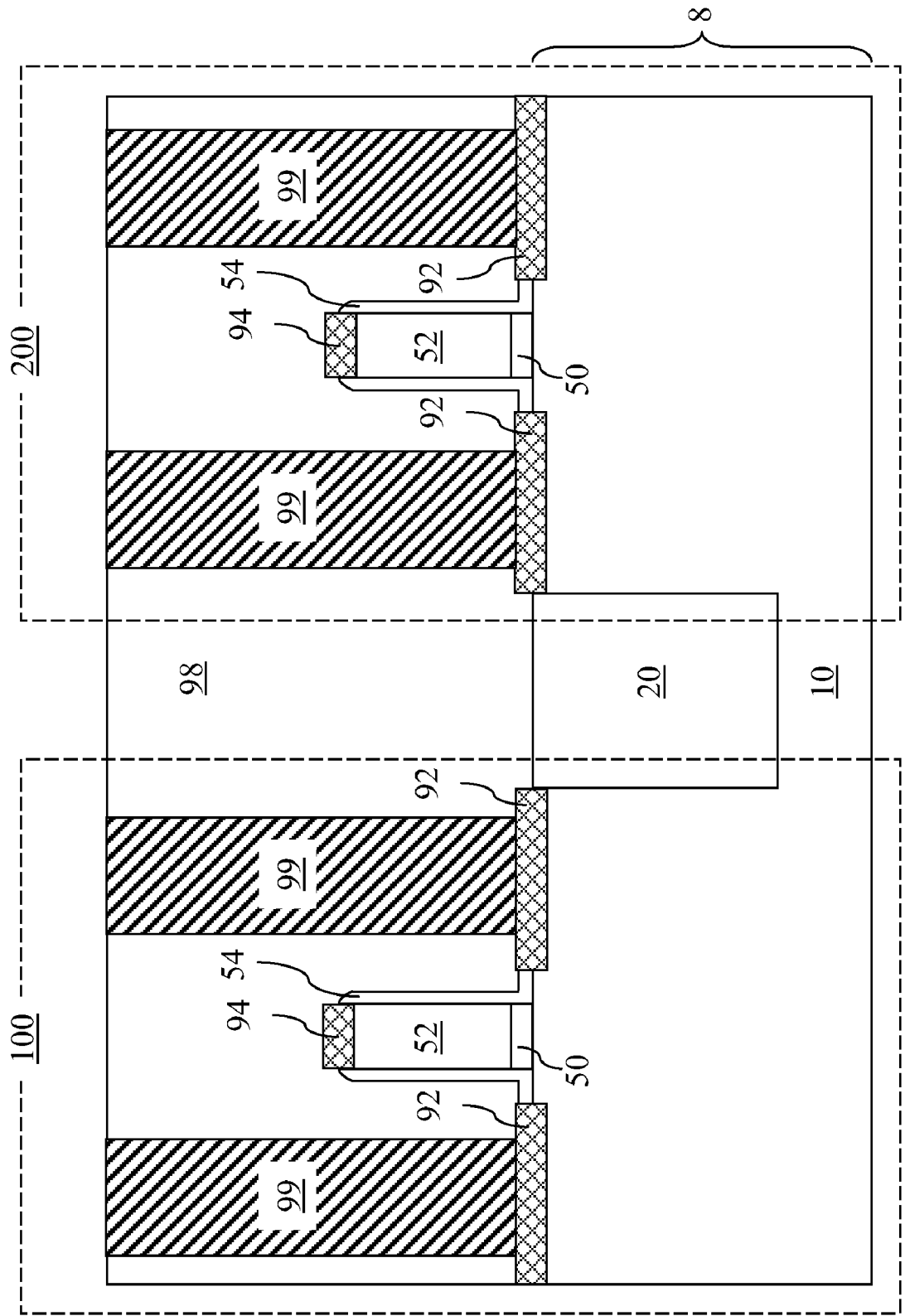

Referring to FIG. 9, a middle-of-line (MOL) dielectric layer 98 is formed over the semiconductor substrate layer 10 and the gate stacks. The MOL dielectric layer 98 abuts the source and drain metal semiconductor alloy regions 92, the gate metal semiconductor alloy portions 94, and the shallow trench isolation structure 20. The MOL dielectric layer 98 may comprise a silicon oxide, a porous or non-porous chemical vapor deposition (CVD) low-k dielectric material, or a porous or non-porous spin-on low-k dielectric material.

The silicon oxide has a dielectric constant of about 3.9. Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide.

The non-porous chemical vapor deposition (CVD) low-k dielectric material and the non-porous spin-on low-k dielectric material have a dielectric constant of about 2.8 or less. Typically, the porous chemical vapor deposition (CVD) low-k dielectric material and the porous spin-on low-k dielectric material have a dielectric constant of about 2.5 or less, and is oftentimes referred to as ultra low-k dielectric materials.

Contact via holes are formed in the MOL dielectric layer 98 and filled with metal to form various contacts 99. Specifically, the contacts 99 vertically abut the source and drain metal semiconductor alloy regions 92.

If the optional dielectric spacers 54 are present, the MOL dielectric layer 98 laterally abuts the sidewalls of the optional dielectric spacers 54, the contacts 99, and the source and drain metal semiconductor alloy regions 92. The low dielectric constant of the MOL dielectric layer 98, which is about 3.9 or less, lowers the parasitic capacitance between the gate electrodes 52 and the contacts 99. Preferably, the MOL dielectric layer 98 has a dielectric constant of 2.8 or less so that the parasitic resistance is lowered even more. At the same time, the gate dielectrics 50 may maintain a high dielectric constant that is provided a high-k dielectric material comprising a dielectric metal oxide that does not have additional oxygen that is typically responsible for a degraded dielectric constant.

Figure 10:
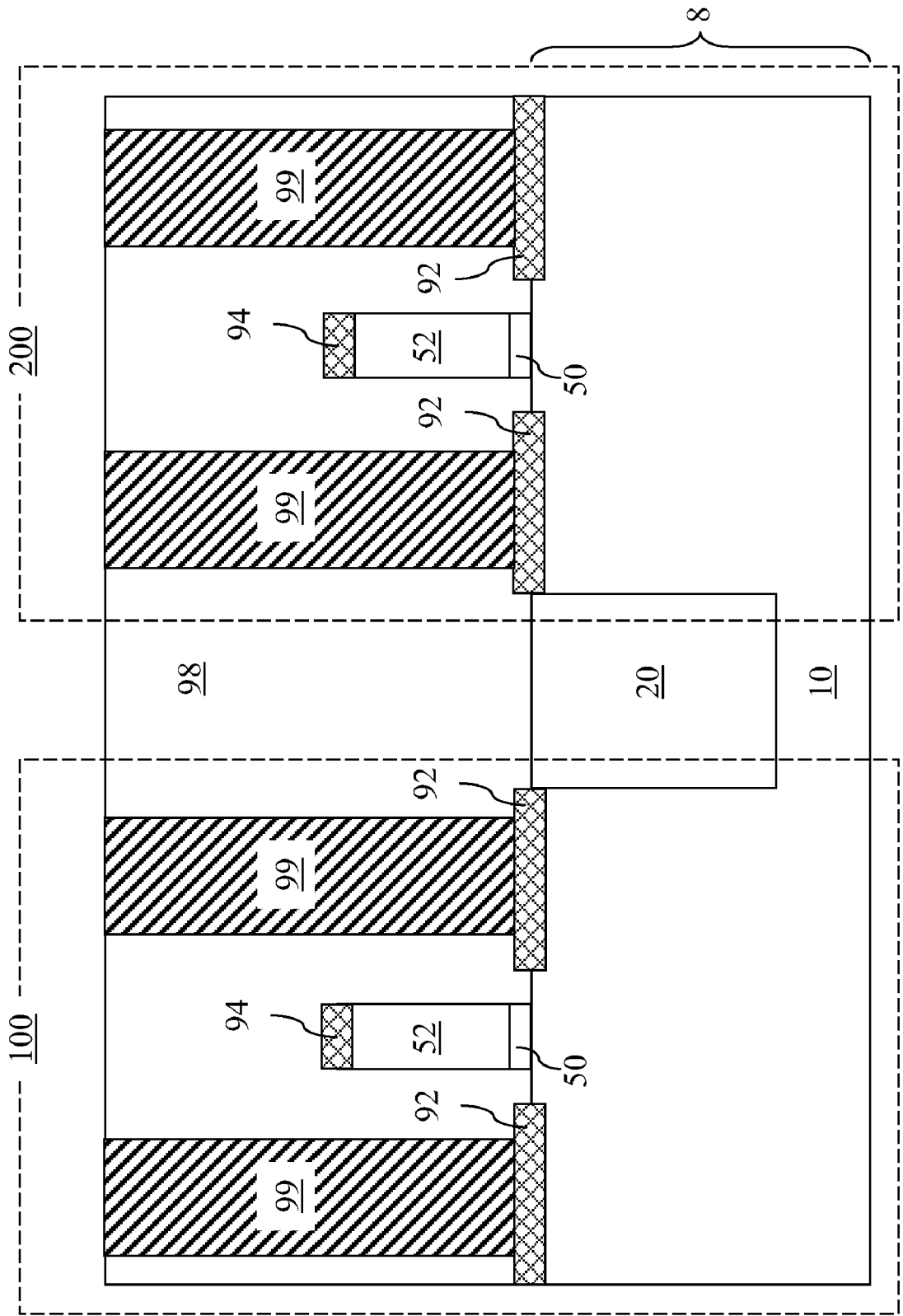
FIG. 10 is a vertical cross-sectional view of a second exemplary semiconductor structure according to a second embodiment of the present invention.

Referring to FIG. 10, a second exemplary semiconductor structure is provided, which is derived from the first exemplary semiconductor structure by omitting the optional dielectric spacers 54. The processing sequence is accordingly modified to omit the formation of the optional dielectric layer 54L.

The MOL dielectric layer 98 laterally abuts the sidewalls of the gate electrodes 52, the gate dielectrics 50, the contacts 99, and the source and drain metal semiconductor alloy regions 92. The low dielectric constant of the MOL dielectric layer 98 lowers the parasitic capacitance between the gate electrodes 52 and the contacts 99 as in the first exemplary semiconductor structure.

Figure 11:
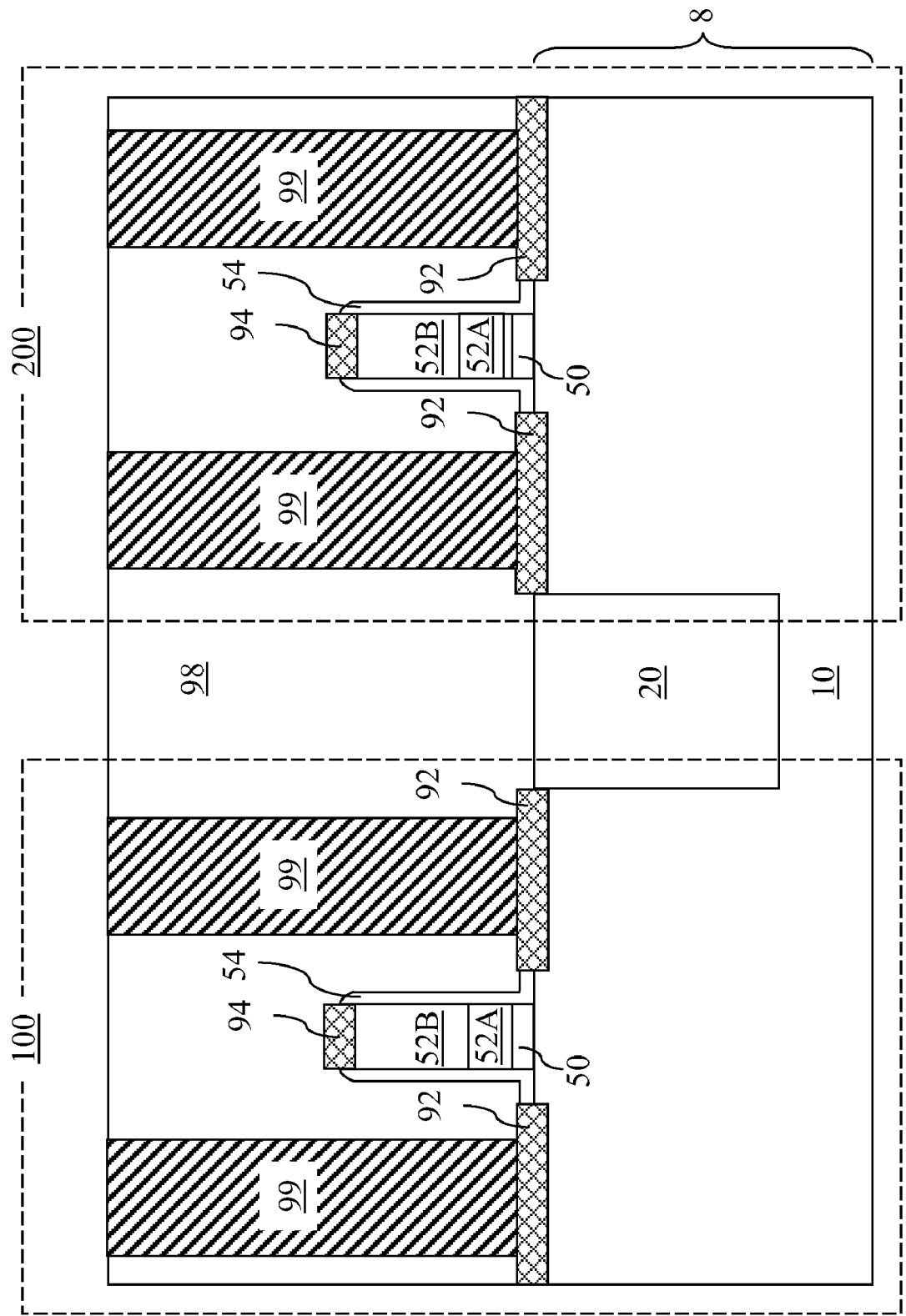
FIG. 11 is a vertical cross-sectional view of a third exemplary semiconductor structure according to a third embodiment of the present invention.

Referring to FIG. 11, a third exemplary semiconductor structure according to a third embodiment of the present invention is provided, in which each of the gate electrodes comprises a stack of a metal gate layer 52A and a doped gate semiconductor layer 52B. The third exemplary semiconductor structure is formed by employing the same methods of the first embodiment. Each stack of the metal gate layer 52A and the doped gate semiconductor layer 52B of the third exemplary semiconductor structure corresponds to a gate electrode 52 of the first exemplary semiconductor structure.

The metal gate layer 52A may be formed by chemical vapor deposition (CVD), physical vapor deposition (PVD), atomic layer deposition (ALD), etc. and comprising a conductive refractory metal nitride. For example, the metal gate layer 52 may comprise a material such as TaN, TiN, WN, TiAlN, TaCN, other conductive refractory metal nitride, or an alloy thereof. The thickness of the metal gate layer 52A may be from about 5 nm to about 40 nm, and preferably from about 7 nm to about 20 nm. The composition of the metal gate layer 52A may be selected to optimize threshold voltages of the NFET and the PFET to be subsequently formed in the NFET region 100 and the PFET region 200.

The doped gate semiconductor layer 52B comprises a doped semiconductor material such as silicon, a silicon germanium alloy, a silicon carbon alloy, or a silicon germanium carbon alloy that is doped with p-type dopants or n-type dopants. If the doped gate semiconductor layer 52B comprises germanium, the concentration of germanium is less than 75% in atomic concentration, and preferably less than 10% in atomic concentration.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
   forming a stack of a gate dielectric and a gate electrode on a semiconductor substrate;
   forming a disposable gate spacer comprising a metal, a metal nitride, or a germanium containing alloy directly on sidewalls of said gate dielectric and said gate electrode;
   forming a stressed silicon nitride layer having an intrinsically compressive stress or an intrinsically tensile stress on said disposable gate spacer;
   transferring stress from said stressed silicon nitride layer into a portion of said semiconductor substrate by performing an anneal while said disposable gate spacer is present on said semiconductor substrate;
   removing said stressed silicon nitride layer;
   forming source and drain metal semiconductor alloy regions that are offset from said sidewalls by said disposable gate spacer on said semiconductor substrate; and
   removing said disposable gate spacer selective to said source and drain metal semiconductor alloy regions and said gate electrode.

2. The method of claim 1, wherein said disposable gate spacer comprises one of Ta, Ti, TaN, TiN, Ge, or a SiGe alloy.

3. The method of claim 1, further comprising:
   forming a middle-of-line dielectric layer comprising a dielectric material having a dielectric constant about 3.9 or less directly on said sidewalls of said gate dielectric and said gate electrode after removal of said disposable gate spacer; and
   forming source and drain contacts directly on said source and drain metal semiconductor alloy regions.

4. The method of claim 3, wherein said middle-of-line dielectric layer comprises a low-k dielectric material having a dielectric constant about 2.8 or less.

5. The method of claim 3, further comprising forming contacts to said source and drain metal semiconductor alloy regions, wherein said middle-of-line dielectric layer laterally contacts said sidewalls and said contacts and vertically contacts said source and drain metal semiconductor alloy regions.

6. The method of claim 1, wherein said disposable gate spacer scavenges oxygen from said gate dielectric during said anneal.

7. A method of forming a semiconductor structure comprising:
   forming a stack of a gate dielectric and a gate electrode on a semiconductor substrate, wherein said gate dielectric comprises a dielectric metal oxide having a dielectric constant about 8.0 or greater;
   forming a disposable gate spacer comprising a metal or a metal nitride directly on sidewalls of said gate dielectric and said gate electrode;
   forming a stressed silicon nitride layer having an intrinsically compressive stress or an intrinsically tensile stress on said disposable gate spacer;
   transferring stress from said stressed silicon nitride layer into a portion of said semiconductor substrate by performing an anneal while said disposable gate spacer is present on said semiconductor substrate;
   removing said stressed silicon nitride layer;
   forming source and drain metal semiconductor alloy regions that are offset from said sidewalls by said disposable gate spacer on said semiconductor substrate; and
   removing said disposable gate spacer selective to said source and drain metal semiconductor alloy regions and said gate electrode.

8. The method of claim 7, wherein said gate dielectric comprises one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each value of x is independently from about 0.5 to about 3 and each value of y is independently from 0 to about 2.

9. The method of claim 7, wherein said disposable gate spacer comprises Ta, Ti, TaN, or TiN.

10. The method of claim 7, further comprising:
    forming a middle-of-line dielectric layer comprising a dielectric material having a dielectric constant about 3.9 or less directly on said sidewalls of said gate dielectric and said gate electrode after removal of said disposable gate spacer; and
    forming source and drain contacts directly on said source and drain metal semiconductor alloy regions.

11. The method of claim 10, wherein said middle-of-line dielectric layer comprises a low-k dielectric material having a dielectric constant about 2.8 or less.

12. A method of forming a semiconductor structure comprising:
    forming a stack of a gate dielectric and a gate electrode on a semiconductor substrate;
    forming a disposable gate spacer comprising a germanium containing material on sidewalls of said gate dielectric and said gate electrode;
    forming a stressed silicon nitride layer having an intrinsically compressive stress or an intrinsically tensile stress on said disposable gate spacer;

transferring stress from said stressed silicon nitride layer into a portion of said semiconductor substrate by performing an anneal while said disposable gate spacer is present on said semiconductor substrate;

removing said stressed silicon nitride layer;

forming source and drain metal semiconductor alloy regions that are offset from said sidewalls by said disposable gate spacer on said semiconductor substrate; and removing said disposable gate spacer selective to said source and drain metal semiconductor alloy regions and said gate electrode.

13. The method of claim 12, further comprising forming a dielectric gate spacer directly on said sidewalls prior to said forming of said disposable gate spacer.

14. The method of claim 13, further comprising:

forming a middle-of-line dielectric layer comprising a dielectric material having a dielectric constant about 3.9 or less directly on said dielectric gate spacer after removal of said disposable gate spacer; and forming source and drain contacts directly on said source and drain metal semiconductor alloy regions.

15. The method of claim 14, wherein said middle-of-line dielectric layer comprises a low-k dielectric material having a dielectric constant about 2.8 or less.

16. The method of claim 15, wherein said disposable gate spacer is formed directly on said sidewalls.

17. The method of claim 16, further comprising:

forming a middle-of-line dielectric layer comprising a dielectric material having a dielectric constant about 3.9 or less directly on said sidewalls of said gate electrode after removal of said disposable gate spacer; and forming source and drain contacts directly on said source and drain metal semiconductor alloy regions.

18. The method of claim 17, wherein said middle-of-line dielectric layer comprises a low-k dielectric material having a dielectric constant about 2.8 or less.

19. The method of claim 12, wherein said germanium containing material comprises at least 75% of germanium in atomic concentration.

20. The method of claim 19, wherein said germanium containing material comprises pure germanium, doped germanium, an undoped silicon germanium alloy, or a doped silicon germanium alloy.

* * * * *